(12) United States Patent  
Taniguchi et al.

(10) Patent No.: US 8,347,493 B2
(45) Date of Patent: Jan. 8, 2013

(54) WIRING BOARD WITH BUILT-IN ELECTRONIC COMPONENT AND METHOD OF MANUFACTURING SAME

(75) Inventors: Hirotaka Taniguchi, Gifu (JP); Toshiki Furutani, Gifu (JP); Takeshi Furusawa, Gifu (JP); Takashi Kariya, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 635 days.

(21) Appl. No.: 12/369,115

(22) Filed: Feb. 11, 2009

(65) Prior Publication Data

US 2009/0242255 A1  Oct. 1, 2009

Related U.S. Application Data

(60) Provisional application No. 61/040,000, filed on Mar. 27, 2008.

(51) Int. Cl.
- *H05K 3/30* (2006.01)
- *H05K 3/00* (2006.01)
- *H05K 3/02* (2006.01)
- *H01R 9/00* (2006.01)

(52) U.S. Cl. ............ 29/832; 29/834; 29/837; 29/841; 29/842; 29/846

(58) Field of Classification Search ............ 29/832, 29/831, 834, 837, 841, 842, 846; 174/250–252, 174/255–256, 258–264
See application file for complete search history.

(56) References Cited

U.S. PATENT DOCUMENTS

| | | | | |
|---|---|---|---|---|
| 4,926,239 A * | 5/1990 | Fujita et al. | | 257/791 |
| 4,941,255 A * | 7/1990 | Bull | | 29/833 |
| 5,027,253 A * | 6/1991 | Lauffer et al. | | 361/321.4 |
| 5,745,984 A * | 5/1998 | Cole et al. | | 29/834 |
| 5,994,166 A * | 11/1999 | Akram et al. | | 438/108 |
| 6,002,592 A * | 12/1999 | Nakamura et al. | | 361/760 |
| 6,038,133 A * | 3/2000 | Nakatani et al. | | 361/760 |
| 6,104,093 A * | 8/2000 | Caletka et al. | | 257/778 |
| 6,136,668 A * | 10/2000 | Tamaki et al. | | 438/462 |
| 6,175,157 B1 * | 1/2001 | Morifuji | | 257/777 |
| 6,338,767 B1 * | 1/2002 | Nakatani et al. | | 156/233 |
| 6,338,980 B1 * | 1/2002 | Satoh | | 438/106 |
| 6,489,685 B2 * | 12/2002 | Asahi et al. | | 257/774 |

(Continued)

FOREIGN PATENT DOCUMENTS

EP   1 770 776 A2   4/2007

(Continued)

*Primary Examiner* — David Angwin

(74) *Attorney, Agent, or Firm* — Oblon, Spivak, McClelland, Maier & Neustadt, L.L.P.

(57) ABSTRACT

A method of manufacturing a wiring board with a built-in electronic component including providing a first base material having a support body and a first metal foil detachably adhered on the support body, forming a connection terminal for mounting an electronic component on the first metal foil of the first base material by an additive method, mounting an electronic component to the connection terminal such that the electronic component is electrically connected to the connection terminal and mounted on the first base material, covering the electronic component with an insulative material structure having a hollow portion such that the electronic component is accommodated in the hollow portion of the insulative material structure after the mounting and detaching the support body from the first metal foil such that a substrate having the first base material and the insulative material structure is formed.

14 Claims, 21 Drawing Sheets

U.S. PATENT DOCUMENTS

| | | | |
|---|---|---|---|
| 6,512,182 B2* | 1/2003 | Takeuchi et al. | 174/256 |
| 6,525,414 B2* | 2/2003 | Shiraishi et al. | 257/686 |
| 6,555,924 B2* | 4/2003 | Chai et al. | 257/788 |
| 6,582,991 B1* | 6/2003 | Maeda et al. | 438/107 |
| 6,625,037 B2* | 9/2003 | Nakatani et al. | 361/762 |
| 6,753,483 B2* | 6/2004 | Andoh et al. | 174/262 |
| 6,784,530 B2* | 8/2004 | Sugaya et al. | 257/686 |
| 6,969,554 B2* | 11/2005 | Kashiwagi et al. | 428/447 |
| 7,068,519 B2* | 6/2006 | Nakatani et al. | 361/762 |
| 7,315,455 B2* | 1/2008 | Furukawa et al. | 361/760 |
| 7,365,273 B2* | 4/2008 | Fairchild et al. | 174/260 |
| 7,514,636 B2* | 4/2009 | Sasaki | 174/252 |
| 7,544,537 B2* | 6/2009 | Kawabata et al. | 438/106 |
| 7,885,081 B2* | 2/2011 | Kawagishi et al. | 361/761 |
| 8,026,614 B2* | 9/2011 | Kawabata et al. | 257/778 |
| 2001/0006258 A1* | 7/2001 | Hur | 257/777 |
| 2001/0018242 A1* | 8/2001 | Kramer et al. | 438/200 |
| 2001/0036711 A1* | 11/2001 | Urushima | 438/460 |
| 2002/0106893 A1* | 8/2002 | Furukawa et al. | 438/652 |
| 2003/0001283 A1* | 1/2003 | Kumamoto | 257/778 |
| 2003/0013233 A1* | 1/2003 | Shibata | 438/114 |
| 2003/0045024 A1* | 3/2003 | Shimoto et al. | 438/106 |
| 2003/0087538 A1* | 5/2003 | Ueno | 439/68 |
| 2003/0137045 A1* | 7/2003 | Sugaya et al. | 257/701 |
| 2004/0145044 A1* | 7/2004 | Sugaya et al. | 257/698 |
| 2004/0160752 A1* | 8/2004 | Yamashita et al. | 361/766 |
| 2004/0178482 A1* | 9/2004 | Bolken et al. | 257/678 |
| 2005/0045369 A1* | 3/2005 | Ishimaru et al. | 174/250 |
| 2005/0130413 A1* | 6/2005 | Shimoto et al. | 438/637 |
| 2005/0142696 A1* | 6/2005 | Tsai | 438/114 |
| 2005/0218491 A1* | 10/2005 | Sasaki et al. | 257/678 |
| 2006/0021791 A1* | 2/2006 | Sunohara et al. | 174/255 |
| 2006/0120056 A1* | 6/2006 | Sasaki | 361/735 |
| 2006/0258053 A1 | 11/2006 | Lee et al. | |
| 2007/0045793 A1* | 3/2007 | Tanaka | 257/678 |
| 2007/0069363 A1* | 3/2007 | Kawabata et al. | 257/698 |
| 2008/0149381 A1* | 6/2008 | Kawagishi et al. | 174/261 |
| 2009/0133251 A1* | 5/2009 | Tuominen et al. | 29/829 |
| 2009/0218678 A1* | 9/2009 | Kawabata et al. | 257/698 |

FOREIGN PATENT DOCUMENTS

| | | |
|---|---|---|
| JP | 2005-135998 | 5/2005 |
| JP | 2005-517287 | 6/2005 |
| JP | 2005-317901 | 11/2005 |
| JP | 2006-165175 | 6/2006 |
| JP | 2006-186029 | 7/2006 |
| JP | 2006-253347 | 9/2006 |
| WO | WO 03/065778 A1 | 8/2003 |
| WO | WO 2007/034629 A1 | 3/2007 |
| WO | WO 2007/080713 A1 | 7/2007 |
| WO | WO 2007/107630 A1 | 9/2007 |

* cited by examiner

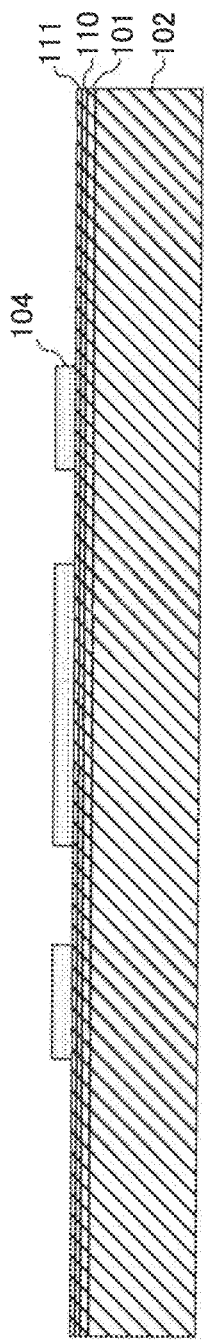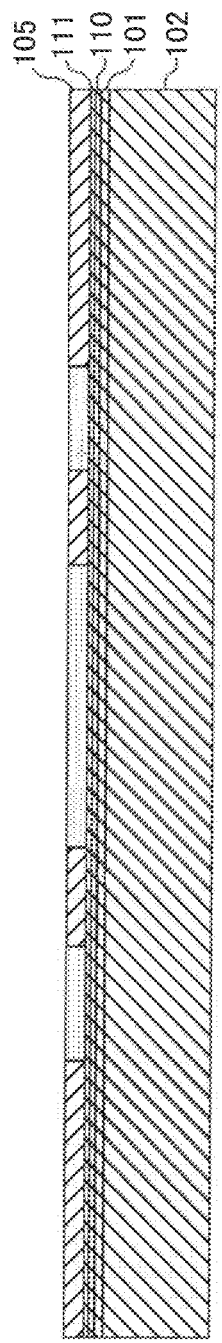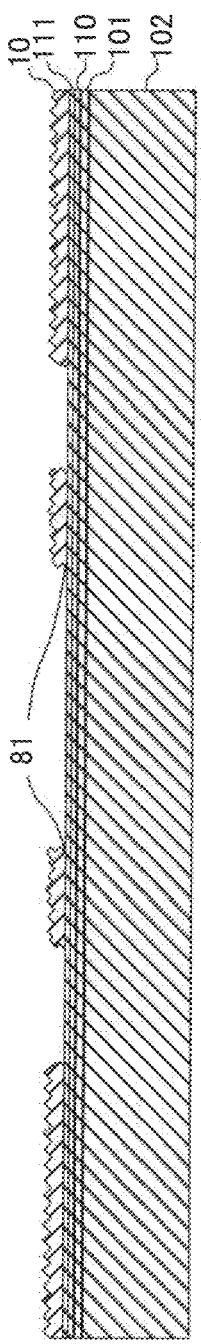

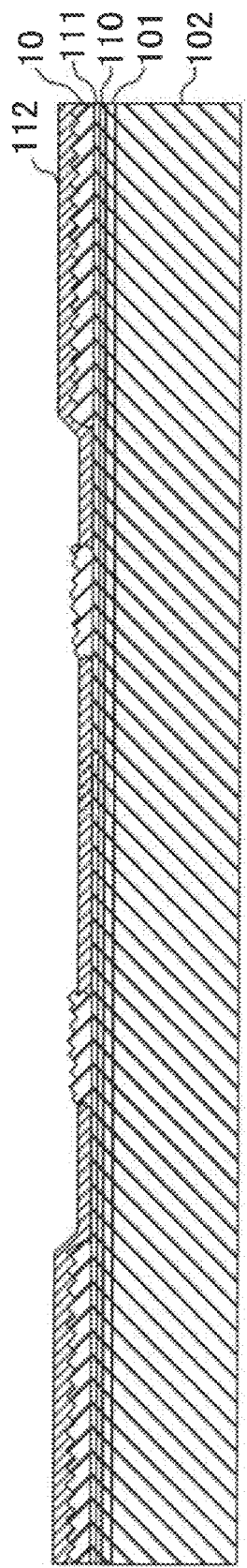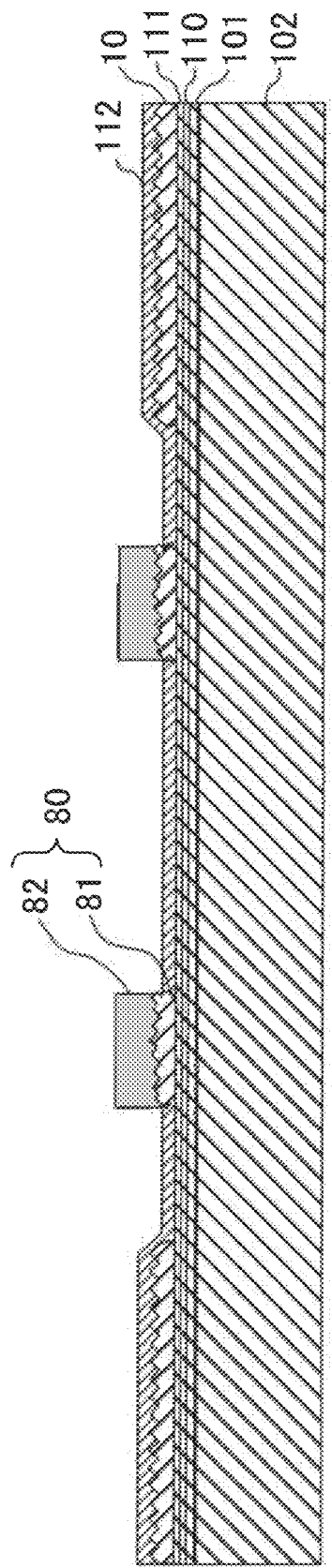

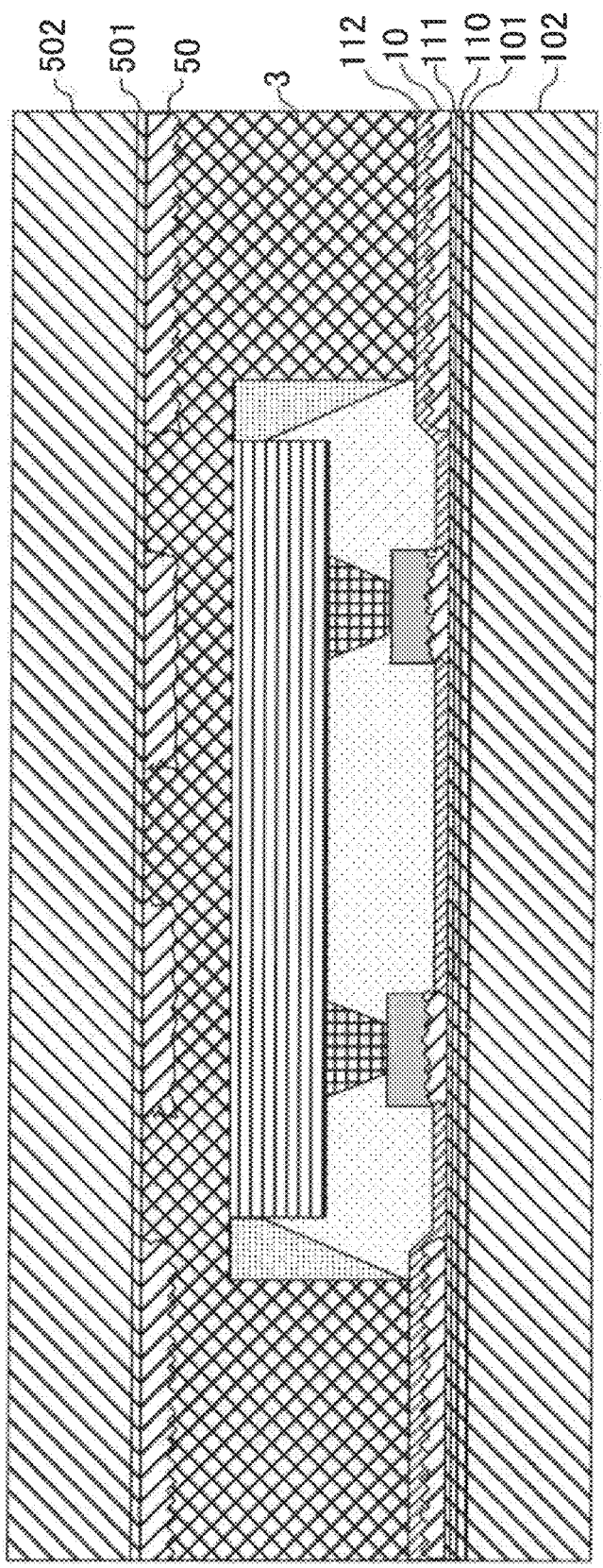

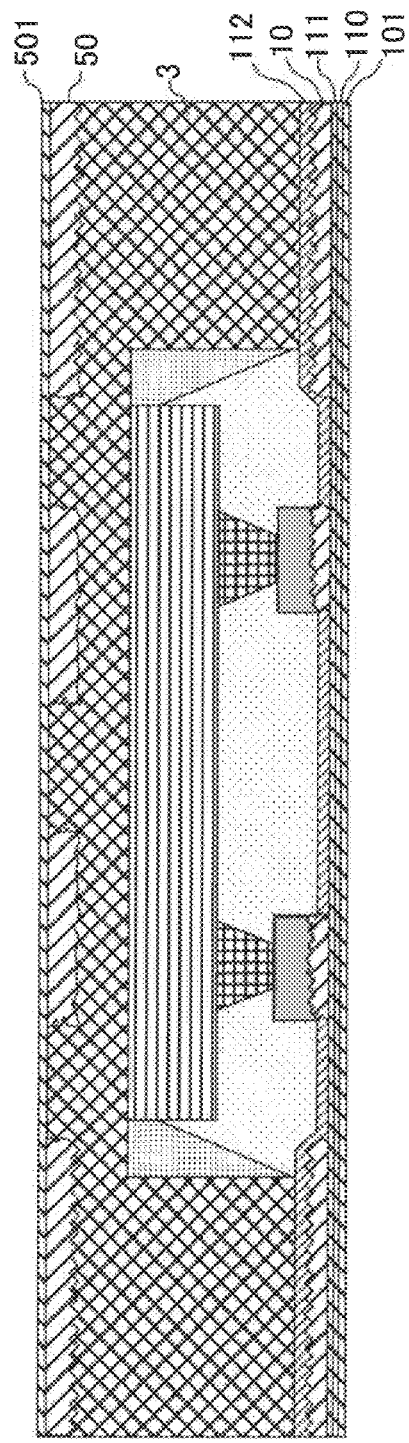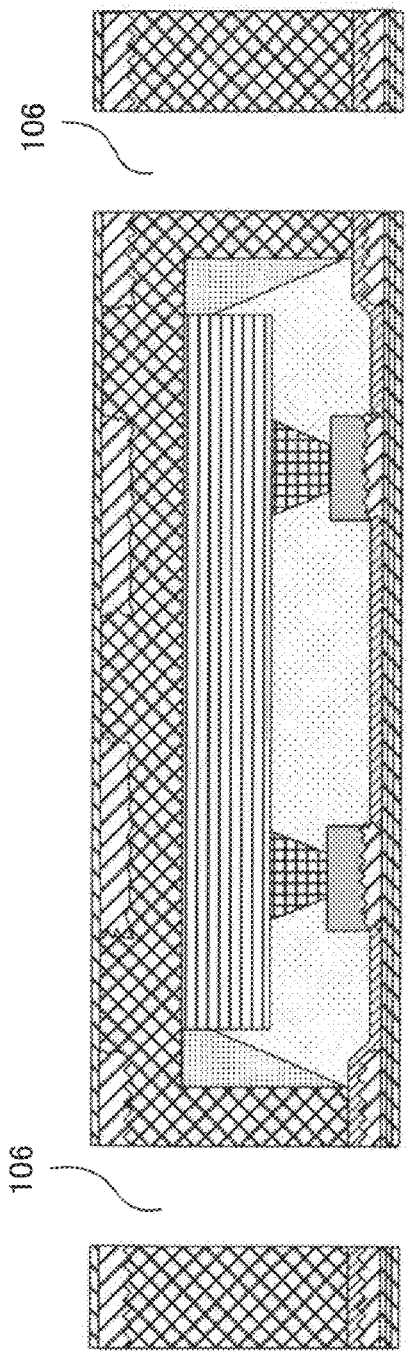

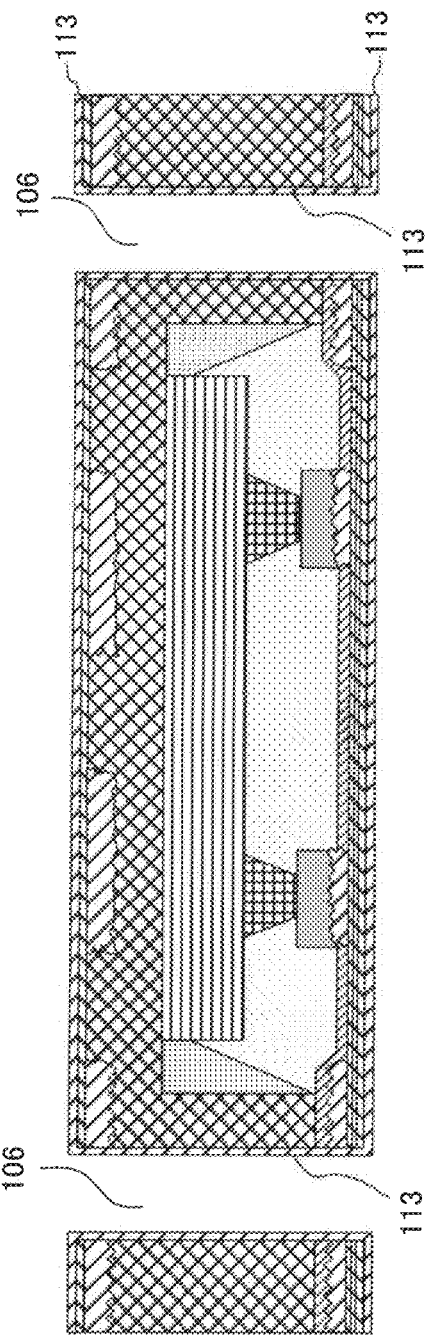
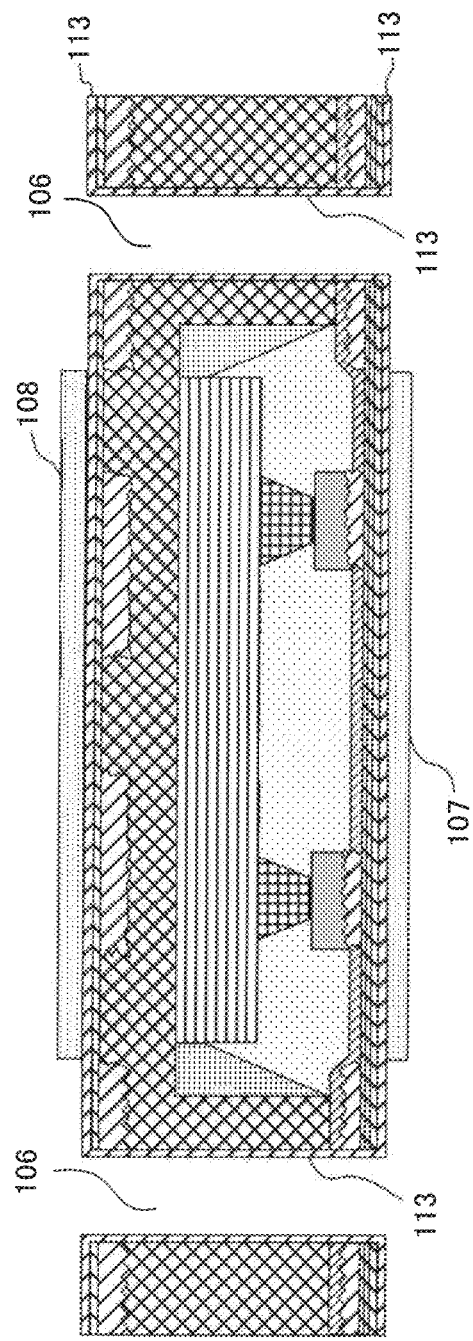
FIG.4C
FIG.4D

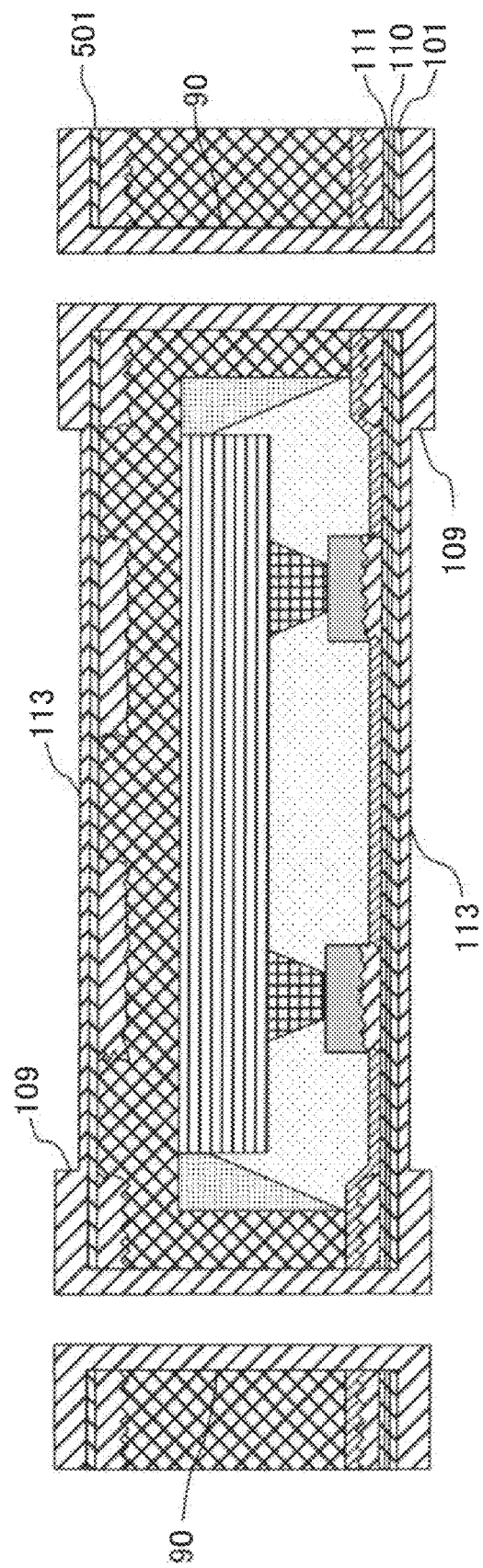

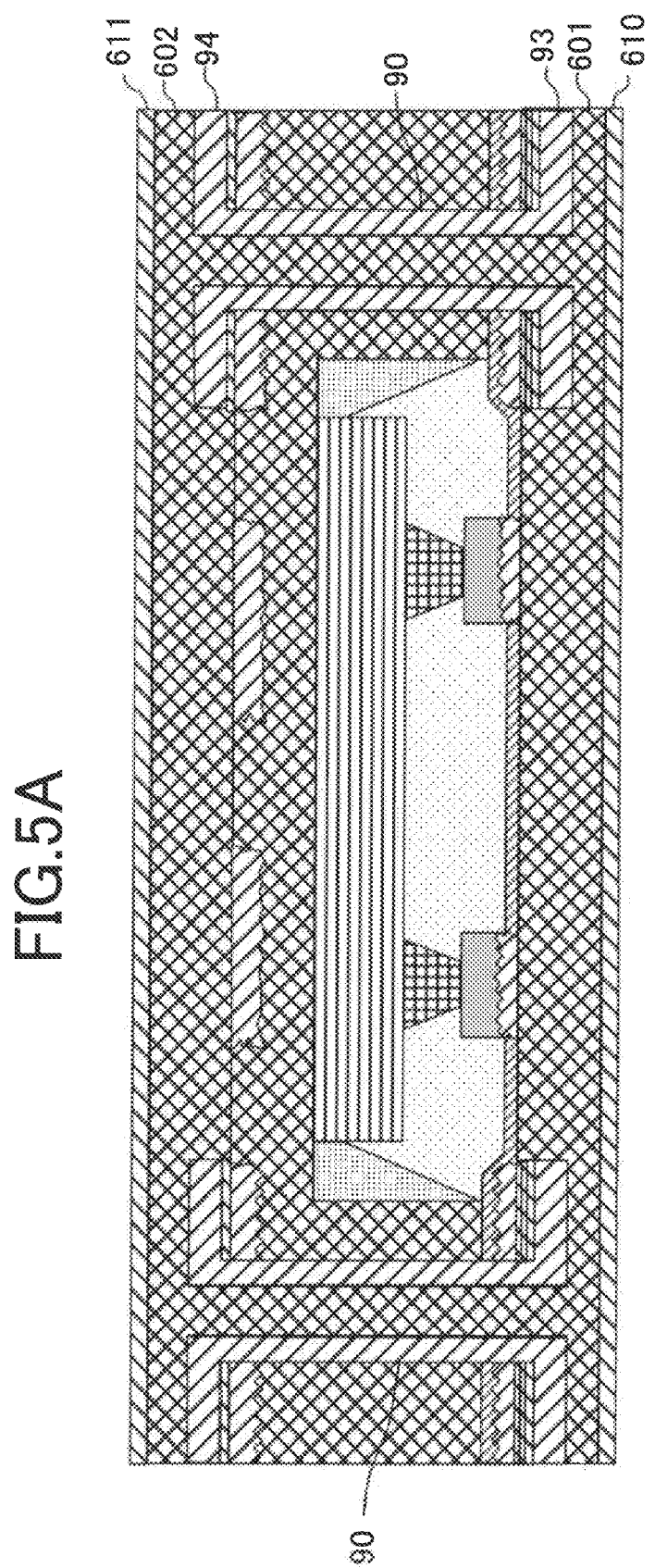

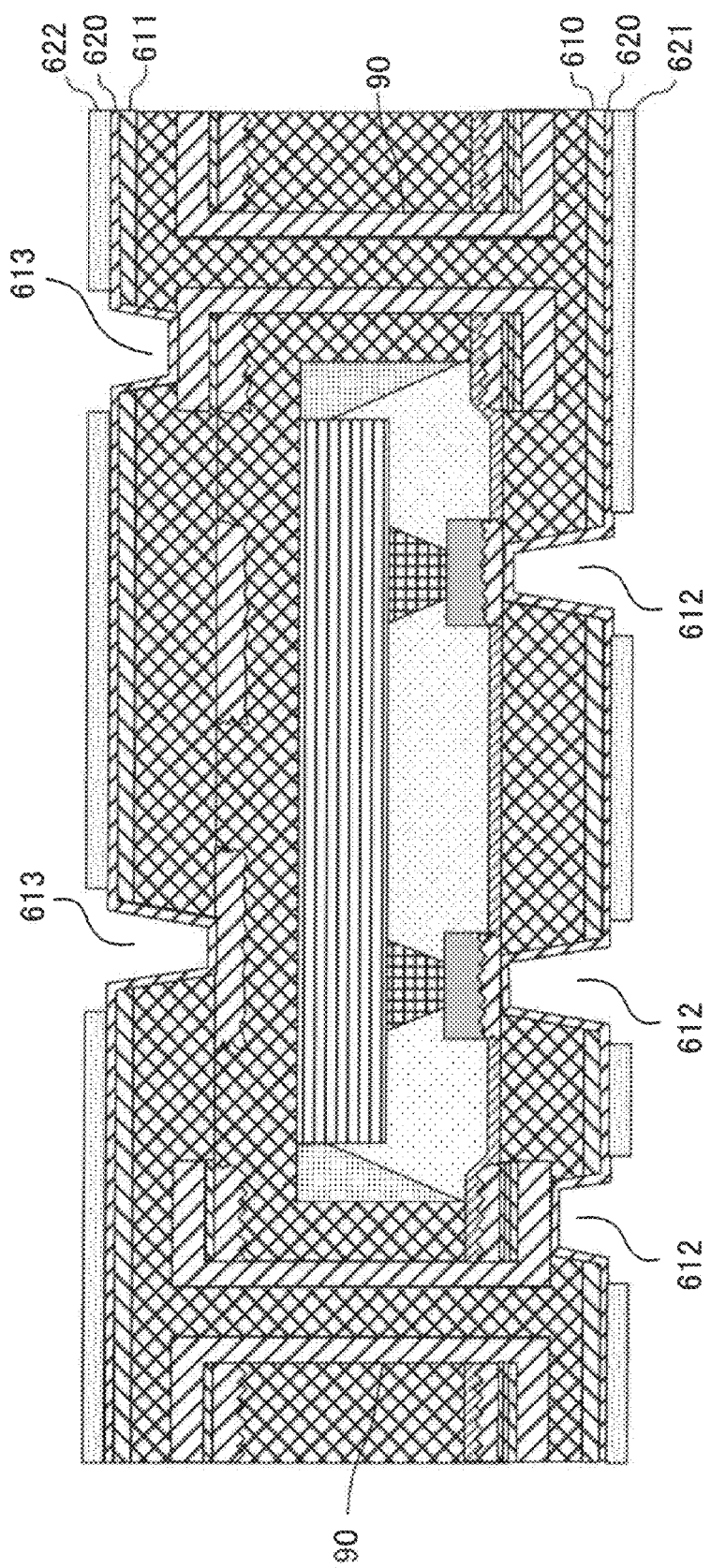

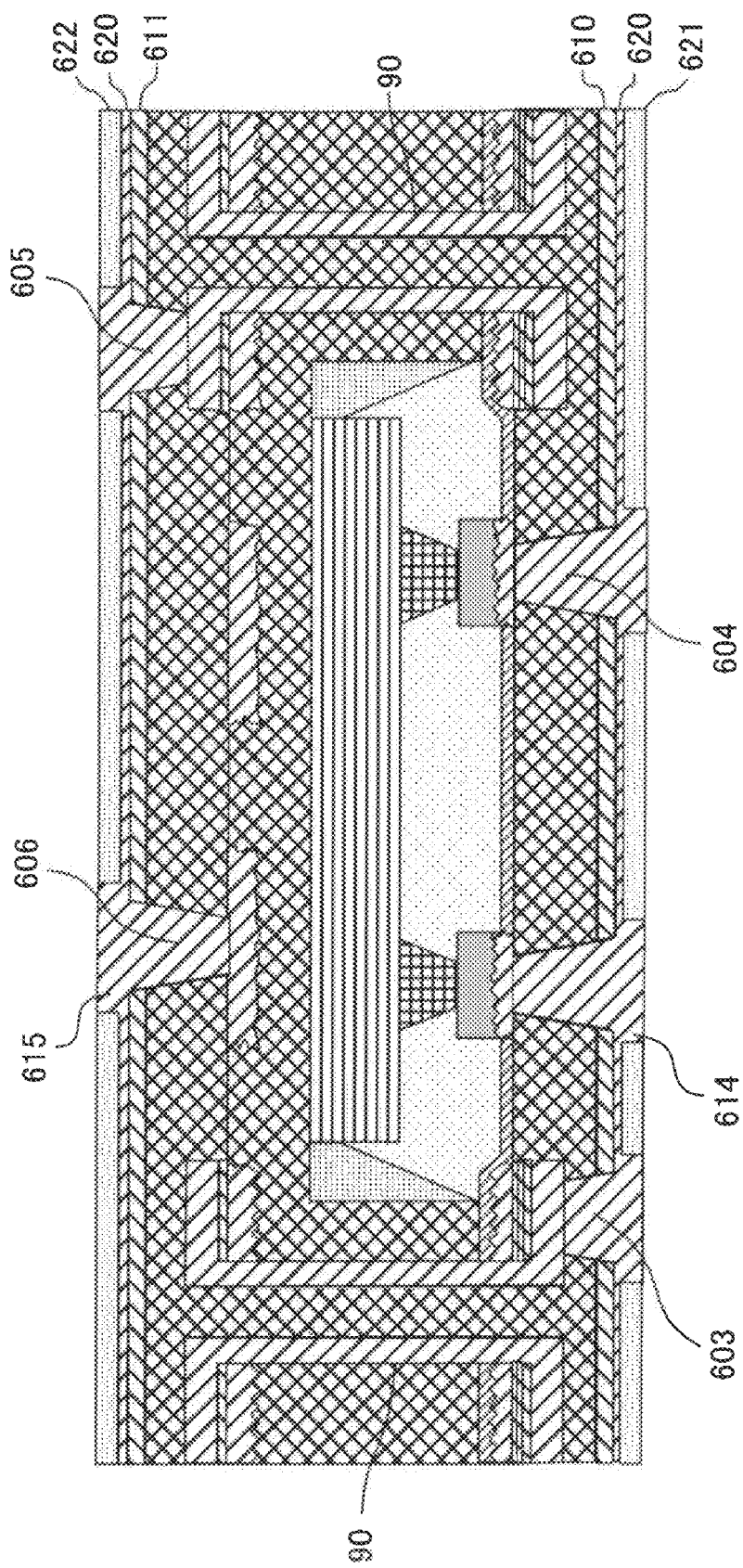

US 8,347,493 B2

WIRING BOARD WITH BUILT-IN ELECTRONIC COMPONENT AND METHOD OF MANUFACTURING SAME

CROSS-REFERENCE TO RELATED APPLICATIONS

The present application claims the benefits of priority to U.S. Application No. 61/040,000, filed Mar. 27, 2008. The contents of that application are incorporated herein by reference in their entirety.

BACKGROUND OF THE INVENTION

1. Field of the Invention

The present invention is related to a wiring board with a built-in electronic component in which an electronic component such as a semiconductor element is accommodated.

2. Discussion of the Background

Recently, electronic devices have become higher performance and compact. Accordingly, demand is increasing for wiring boards mounted in such electronic devices to become more highly functional and integrated. For example, in Japanese Translation of PCT International Publication 2005-517287, an electronic component is built into a wiring board. The contents of this publication are incorporated herein by reference in their entirety.

SUMMARY OF THE INVENTION

According to one aspect of the present invention, a method of manufacturing a wiring board with a built-in electronic component includes providing a first base material comprising a support body and a first metal foil detachably adhered on the support body, forming a connection terminal for mounting an electronic component on the first metal foil of the first laminated base material by an additive method, electrically connecting an electronic component and the connection terminal by arranging the electronic component on the first base material such that a surface of the electronic component on which a circuit is formed faces a surface on which the connection terminal is formed, and covering the electronic component with an insulative material after the mounting, detaching the support body and the first metal foil.

According to another aspect of the present invention, a wiring board with a built-in electronic component has a connection terminal formed by an additive method, an electronic component electrically connected to the connection terminal, an insulative material covering the electronic component, a conductive pattern embedded in the insulative material, a through-hole conductor formed in the insulative material, and a through-hole land connected to the through-hole conductor. The through-hole land protrudes beyond a surface of the insulative material.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1A-1H are cross-sectional views illustrating the steps to form a connection terminal;

FIGS. 3A-3C are cross-sectional views illustrating the lamination step;

FIGS. 4A-4E are cross-sectional views illustrating the later steps;

FIGS. 5A-5E are cross-sectional views illustrating the steps to manufacture a multilayer wiring board using the wiring board with a built-in electronic component shown in FIG. 4F;

DETAILED DESCRIPTION OF THE EMBODIMENTS

Figure 1A:
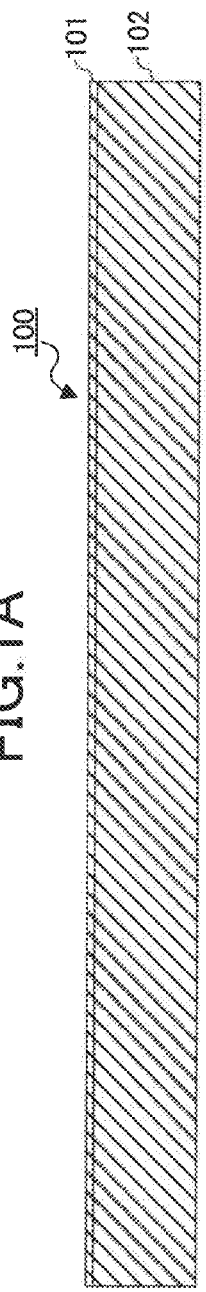

The embodiments will now be described with reference to the accompanying drawings, wherein like reference numerals designate corresponding or identical elements throughout the various drawings.

Figure 4F:
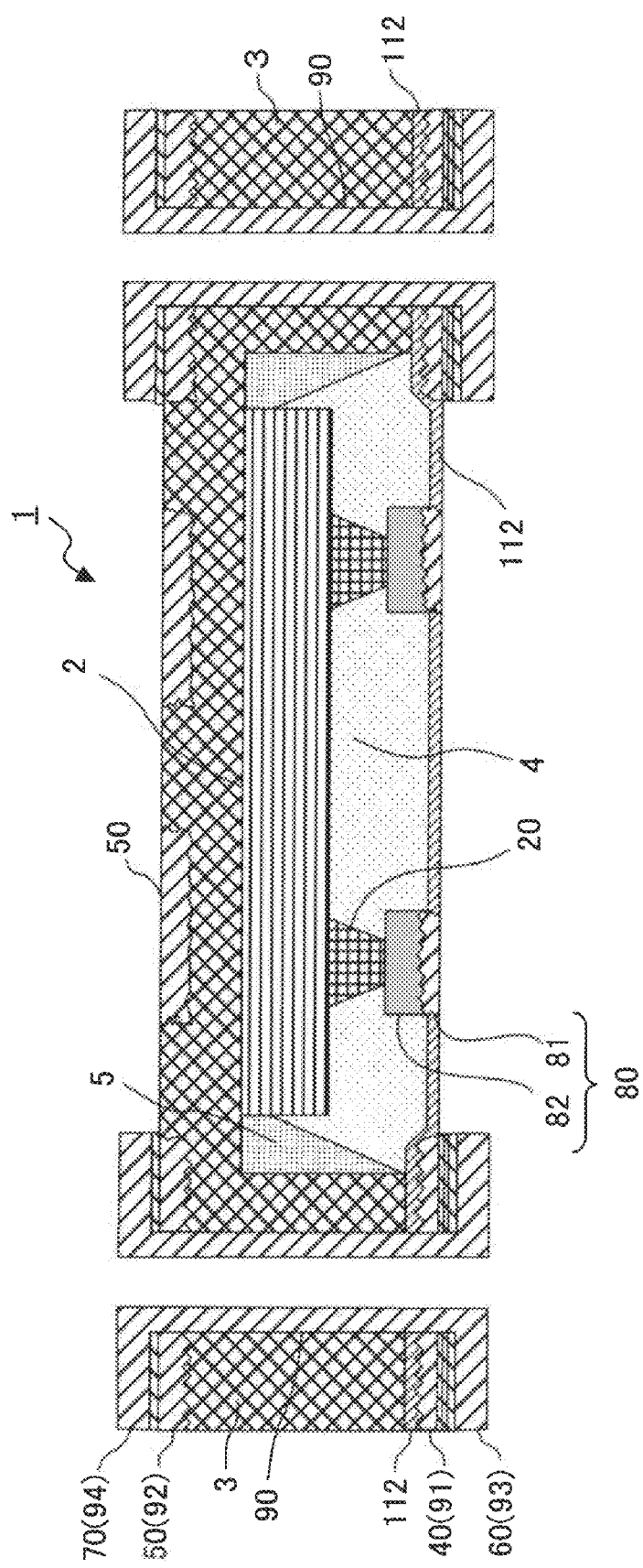
FIG. 4F is a cross-sectional view illustrating the structure of a wiring board with a built-in electronic component according to an embodiment of the present invention.

FIG. 4F is a cross-sectional view schematically illustrating a wiring board 1 with a built-in electronic component according to an embodiment of the present invention. Wiring board 1 with a built-in electronic component is used, for example, as a core substrate or the like in a multilayer printed wiring board.

Wiring board 1 with a built-in electronic component is structured with electronic component 2, insulative material 3, under-fill material 4, filling resin 5, inner-layer conductive patterns 40, 50, solder resist layer 112, outer-layer conductive patterns 60, 70, connection terminals 80 and through-hole conductors 90.

Insulative material 3 is a board made by impregnating a reinforcing material, for example, glass fabric or aramid fabric, with resin such as epoxy resin, polyester resin, polyimide resin, bismaleimide-triazine resin (BT resin) or phenolic resin. In this embodiment, it is formed with a prepreg.

Underfill material 4 is, for example, an insulative resin containing inorganic filler such as silica or alumina, and plays a role to secure the anchoring strength of electronic component 2 as well as to absorb warping generated due to the difference in the thermal expansion coefficients of electronic component 2 and insulative material (such as insulative material 3 or filling resin 5). Underfill material 4 is preferred to be made of a thermosetting resin with inorganic filler in the range of 40-90 weight percent. In addition, the size of the filler (average particle diameter) is preferred to be set at 0.1-3.0 μm.

Filling resin 5 is preferably made of a thermosetting resin and inorganic filler. As for the inorganic filler, for example, $Al_2O_3$, $MgO$, $BN$, $AlN$ or $SiO_2$ may be used. As for the thermosetting resin, resins with high tolerance to heat such as epoxy resin, phenolic resin or cyanate resin are preferred. Among them, epoxy resin is especially preferred for an excellent tolerance to heat.

Conductive pattern 40 made of copper or the like is formed in the interior (hereinafter referred to as a first inner layer) of the first-surface side (the side facing the surface where the circuit of electronic component 2 is formed) of wiring board 1 with a built-in electronic component. The thickness of conductive pattern 40 is approximately 15 μm, and part of it will become pads 81 of connection terminals 80 or through-hole lands 91 of the first inner layer connected to through-hole conductors 90.

Conductive pattern 50 made of copper or the like is formed inside (hereinafter referred to as a second inner layer) the second surface (the main surface opposite the first surface) of wiring board 1 with a built-in electronic component. Part of it will become through-hole lands 92 of the second inner layer connected to through-hole conductors 90 and its thickness is approximately 15 μm. Through-hole land 91 of the first inner layer and through-hole land 92 of the second inner layer are electrically connected by means of through-hole conductor 90.

Conductive pattern 60 made of copper or the like is formed on the first surface (hereinafter referred to as the first outer layer) of wiring board 1 with a built-in electronic component, and part of it will become through-hole lands 93 of the first outer layer connected to through-hole conductors 90. The thickness of conductive pattern 60 is approximately 20 μm.

Conductive pattern 70 made of copper or the like is formed on the second surface (hereinafter referred to as the second outer layer) of wiring board 1 with a built-in electronic component, and part of it will become through-hole lands 94 of the second outer layer connected to through-hole conductors 90. The thickness of conductive pattern 70 is approximately 20 μm.

Connection terminal 80 is a terminal to be electrically connected to electronic component 2 and is formed with pad 81 and joining layer 82. The thickness of pad 81 is approximately 15 μm. Joining layer 82 is formed with, for example, tin plating, solder plating or alloy plating such as tin/silver/copper plating, or with a solder alloy containing tin, silver and copper. Its thickness is approximately 15 μm.

Bump 20 (for example, a gold-stud bump with an approximate thickness of 30 μm) is formed on electronic component 2. Bump 20 and connection terminal 80 are electrically connected.

In the following, a method of manufacturing wiring board 1 with a built-in electronic component is described with reference to FIGS. 1A-4E.

(1) Step to Form Connection Terminals 80 (FIGS. 1A-1H)

To begin with, first base material 100 as shown in FIG. 1A is prepared. First base material 100 is a so-called copper foil with a carrier, made by bonding copper foil 101 and copper carrier 102 using an adhesive agent (removable layer) so as to be removable (detachable). Here, the thickness of copper foil 101 is approximately 5 μm and the thickness of carrier 102 (also referred herein as "support body") is approximately 70 μm. As for carrier 102, it is not limited to using copper, but an insulative material may be employed.

Next, on copper foil 101 of first base material 100, connection terminals 80 to mount electronic component 2 are formed using an additive method.

Figure 1B:
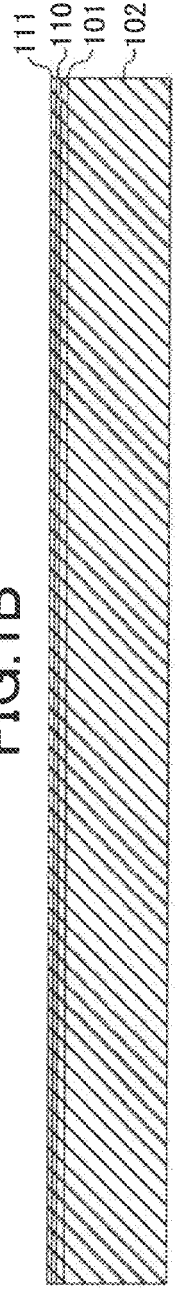

Before forming connection terminals 80 by an additive method, as shown in FIG. 1B, a metal such as nickel is disposed as first undercoating layer 110 to be approximately 1 μm thick using a method such as electroless plating, electrolytic plating or sputtering on the entire surface of copper foil 101 of first base material 100. In doing so, erosion by etching may be prevented and fine patterns may be formed.

Also, if solder resist layer 112 is formed in a case such as the present embodiment, a metal such as titanium is disposed as second undercoating layer 111 approximately 0.1 μm thick on the entire surface of the first undercoating layer as shown in FIG. 1B, using a method such as electroless plating or sputtering. In doing so, an enhanced adhesiveness with solder resist layer 112 is expected.

Here, an additive method indicates a method in which plating grows in the area where a plating resist pattern is not formed, and then a conductive pattern is formed by removing the plating resist. In the following, the method is specifically described.

Figure 1C:
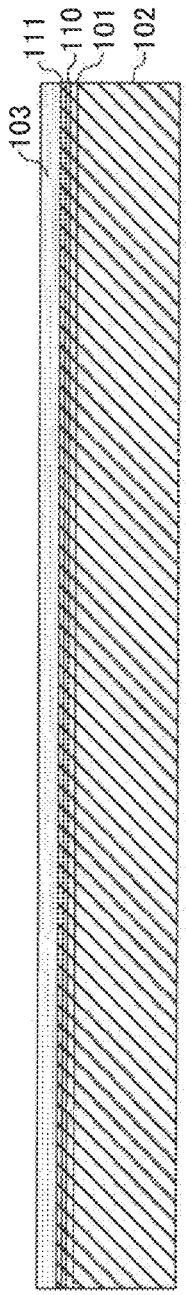

On second undercoating layer 111 of the substrate shown in FIG. 1B, dry-film photosensitive resist 103 is laminated (see FIG. 1C). Then, a mask film is adhered on the laminated photosensitive resist 103, which is exposed to ultraviolet rays and developed with an alkaline solution. As a result, plating resist layer 104 is formed in which only the portions corresponding to conductive pattern 10 are open (see FIG. 1D).

In the following, after the substrate shown in FIG. 1D is washed with water and dried, electrolytic copper plating is performed to form copper-plated layer 105 with an approximate thickness of 15 μm (see FIG. 1E).

Next, after plating resist layer 104 is removed and conductive pattern 10 and pads 81 are formed, their surfaces are roughened by a surface roughening treatment such as black-oxide treatment or chemical etching treatment (CZ treatment) (see FIG. 1F).

Then, on the surface of the substrate shown in FIG. 1F, solder resist layer 112 with openings corresponding to pads 81 is formed (see FIG. 1G), and joining layers 82 are formed (see FIG. 1H). Here, joining layers 82 are formed by, for example, tin plating, solder plating or alloy plating using tin/silver/copper plating; alternatively, it may be formed by printing solder paste made of an alloy containing tin, silver and copper and then conducting a reflow process.

Accordingly, connection terminals 80 to be joined with bumps 20 of electronic component 2 are obtained.

As described, etching is not required in an additive method, thus fine-pitch conductive pattern 10 and connection terminals 80 may be formed.

Figure 2A:
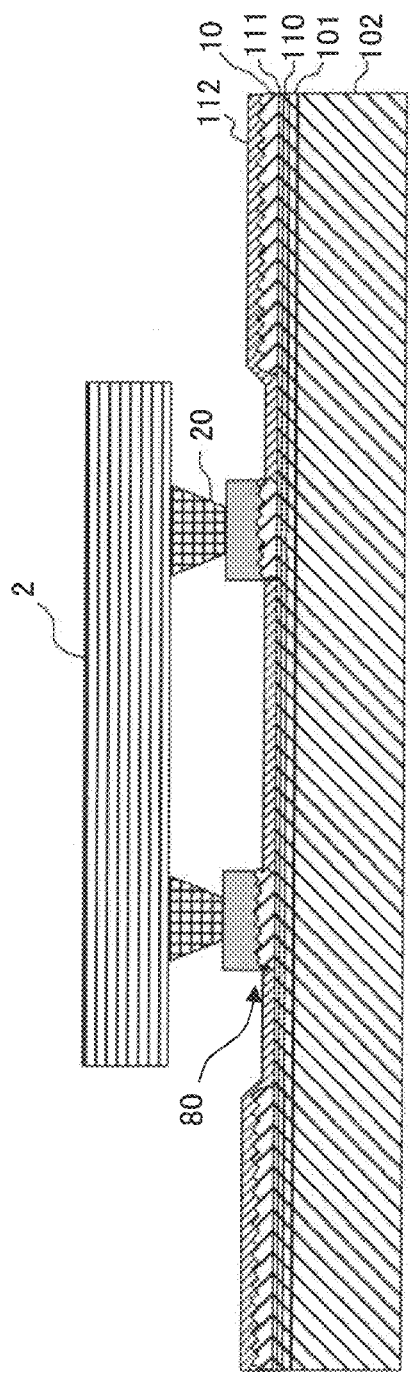
FIGS. 2A-2B are cross-sectional views illustrating the steps to mount an electronic component.
Figure 2B:
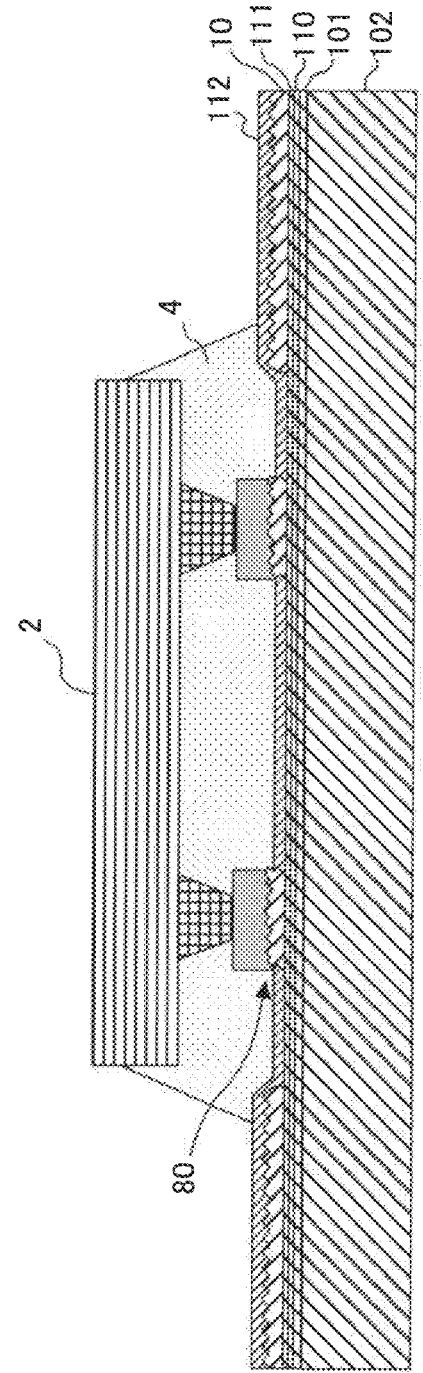

(2) Step to Mount Electronic Component 2 (FIGS. 2A, 2B)

In the following, electronic component 2 is mounted on first base material 100 by using a flip-chip method to bond bumps 20 of electronic component 2 and connection terminals 80 formed on first base material 100 (see FIG. 2A). After mounting electronic component 2, underfill material 4 is filled in a gap left between electronic component 2 and first base material 100 (see FIG. 2B). As described above, underfill material 4 is, for example, insulative resin containing inorganic filler such as silica or alumina.

Figure 3A:
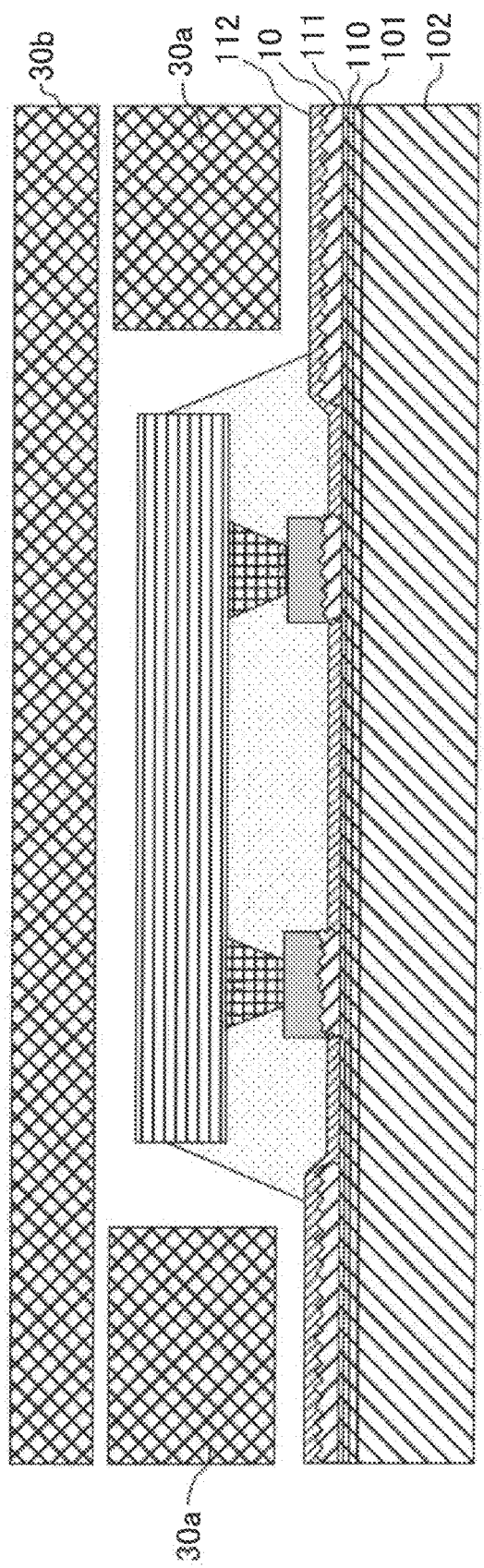
Figure 3B:
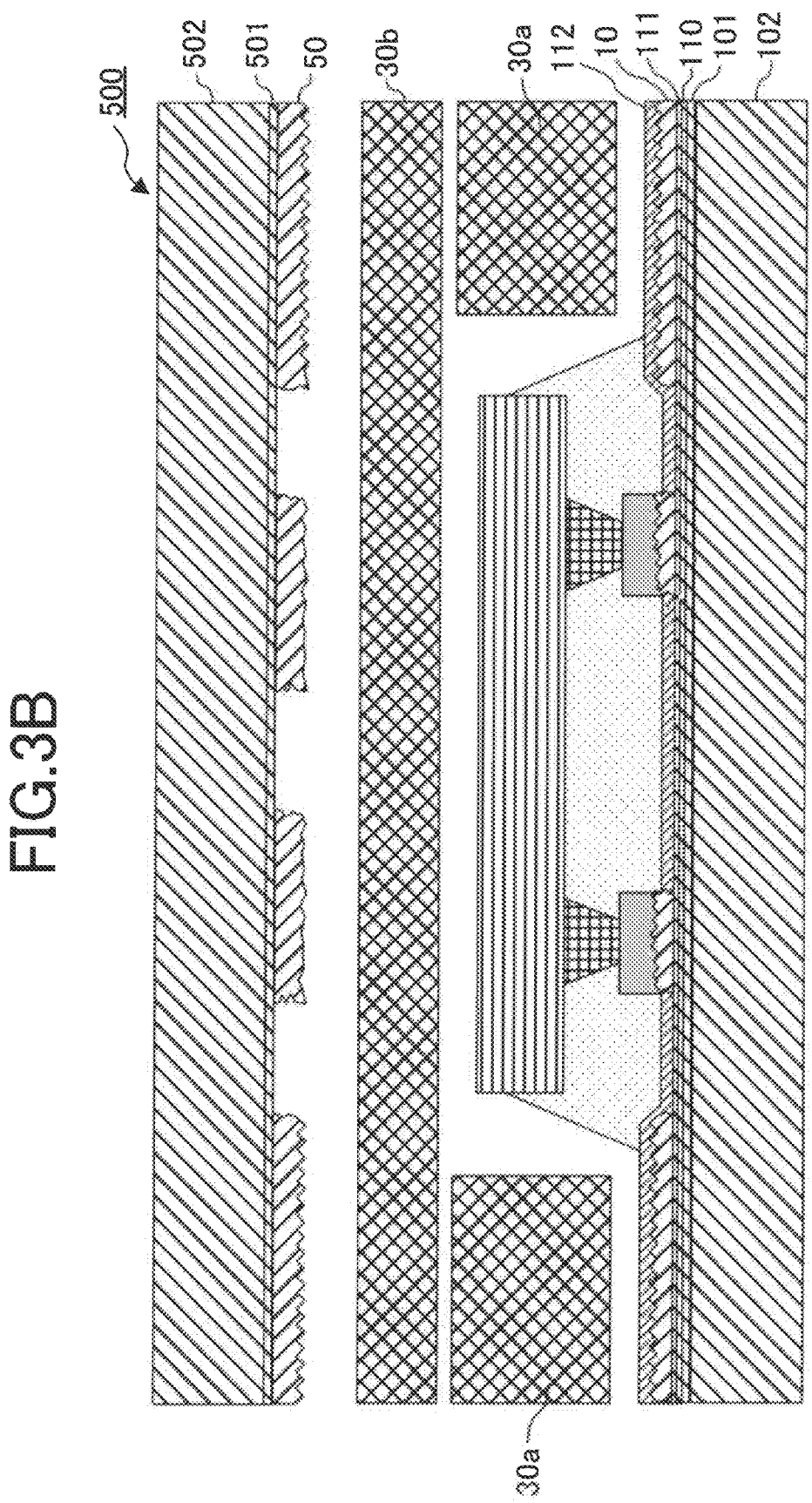

(3) Lamination Step (FIGS. 3A-3C)

In the following, insulative material (30a) and insulative material (30b) are laminated on the mounting surface for electronic component 2 on first base material 100 (see FIG. 3A). Insulative materials (30a, 30b) are board material (prepreg in this embodiment) made by impregnating reinforcing material such as glass cloth with resin. Insulative material (30a) is processed to have a hollow according to the configuration of electronic component 2. Electronic component 2 is placed parallel to the mounting surface so as to be surrounded by the hollow. For the hollow-forming process, a piercing process (punching) is preferred, but a mechanical drill or a laser may also be used. On the other hand, insulative material (30b) is in a sheet form without a hollow, and is placed on insulative material (30a) and on the surface of electronic component 2 opposite the surface where bumps 20 are formed.

After disposing insulative materials (30a, 30b), second base material 500 with conductive pattern 50 is laminated on insulative material (30b) in such a way that the surface where conductive pattern 50 is formed adheres to the top surface of insulative material (30b) (see FIGS. 3B, 3C).

Second base material 500 is a copper foil with a carrier, similar to first base material 100. It is formed with copper foil 501 with an approximate thickness of 5 µm and carrier 502 with an approximate thickness of 70 µm. Conductive pattern 50 is formed by an additive method, the same method used for forming conductive pattern 10. Namely, first, a dry-film photosensitive resist is laminated on copper foil 501 of second base material 500, a mask film is adhered to the photosensitive resist, exposed to light and developed to form a plating resist layer with openings formed only in the area corresponding to conductive pattern 50. Then, after second base material 500 with the plating resist layer is washed with water and dried, electrolytic copper plating is performed to form conductive pattern 50.

Before second base material 500 is laminated as above, a roughened layer is formed on the surface of conductive pattern 50 using a surface roughening method such as black oxide treatment or chemical etching treatment (CZ treatment). Also, for the above lamination of second base material, for example, an autoclave method or a hydraulic-pressing method may be used. In addition, by pressurization through such a method, insulative material (30a) and insulative material (30b) are fused and insulative material 3 is formed (see FIG. 3C). Furthermore, during such a process, a resin ingredient flows out from insulative materials (30a, 30b) and the gap left between electronic component 2 and insulative materials (30a, 30b) is filled with filling resin 5.

(4) Later Steps (FIGS. 4A-4E)

In the following, carrier 102 and carrier 502 are removed (detached) from the substrate shown in FIG. 3C to obtain the substrate shown in FIG. 4A. Then, by a known method using a mechanical drill or the like, penetrating holes 106 are formed in the substrate in FIG. 4A (see FIG. 4B). After forming penetrating holes 106, electroless copper plating is performed on the substrate shown in FIG. 4B to form copper-plated layer 113 on both main surfaces and the inner walls of penetrating holes 106 (see FIG. 4C).

Then, a dry-film photosensitive resist is laminated on both main surfaces of the substrate shown in FIG. 4C, and a mask film is adhered to the photosensitive resist, exposed to light and developed. Accordingly, plating resist layer 107 with openings formed only in the area corresponding to conductive pattern 60, and plating resist layer 108 with openings formed only in the area corresponding to conductive pattern 70 are formed (see FIG. 4D).

Next, after the substrate shown in FIG. 4D is washed with water and dried, electrolytic copper plating is performed and plating resist layer 108 is removed. Accordingly, as shown in FIG. 4E, copper-plated film 109 and through-hole conductors 90 are formed. Then, unnecessary portions of copper-plated layer 113, copper foil 101, first undercoating layer 110, second undercoating layer 111 and copper foil 501 are removed by etching from both main surfaces of the substrate shown in FIG. 4E. Accordingly, wiring board 1 with a built-in electronic component is obtained as shown in FIG. 4F in which conductive pattern 60 (through-hole lands 93 of first outer layer) and conductive pattern 70 (through-hole lands 94 of the second outer layer) are formed.

For the etching here, a so-called quick etching method, which does not use a resist metal (or which uses a slightly plated resist metal such as tin), may be employed.

Wiring board 1 with a built-in electronic component manufactured as above shows the following excellent features.

(1) Since an electronic component 2 is accommodated (built in), another electronic component or the like may be mounted in a mounting region on the surface layer, thus the wiring board may become highly functional. Also, by flip-chip mounting the electronic component to be built in, the wiring board may be made thin (compact).

(2) Also, (a) by forming in advance connection terminals 80 for mounting an electronic component on first base material 100, (b) by setting the thickness for first base material 100 large (approximately 75 µm), and (c) by forming conductive pattern 40 and connection terminals 80 using an additive method, and so forth, conductive pattern 40 and connection terminals 80 may be made with a fine pitch (for example, 50 µm). Also, since carrier 102 of first base material 100 is easily removed by peeling it off, potential damage to connection terminals may be substantially reduced when unnecessary metal layers are removed. Furthermore, after connection terminals 80 and conductive pattern 40 are formed, they are not etched in the later process, thus retaining the initial pattern configuration. Accordingly, the pattern accuracy may be enhanced.

(3) Also, since the accommodated electronic component 2 is covered and sealed by underfill material 4 and insulative material 3, its anchoring strength is high. Therefore, in a step to form multiple layers, such as a build-up step, using wiring board 1 with a built-in electronic component as a core substrate, its handling becomes easier. Furthermore, while processing etching or the like, the impact on electronic component 2 may be substantially prevented.

(4) Also, wiring board 1 with a built-in electronic component is formed (symmetrical structure) in such a way that insulative materials (underfill material 4 and insulative material 3) sandwich electronic component 2 from below and above on the mounting surface. With such a symmetrical structure, stress from forces (such as heat, impact from vibration or being dropped) may be eased, thus tolerance to warping may be achieved. Accordingly, connection reliability of the electronic component is enhanced.

(5) Furthermore, in wiring board 1 with a built-in electronic component, inner-layer conductive patterns 40, 50 are embedded in insulative material 3; and through-hole land 93 of the first outer layer and through-hole land 94 of the second outer layer are formed to protrude beyond insulative material 3. Then, the thickness (approximately 35 µm) of the through-hole land on the first-surface side, which is made up of through-hole land 91 of the first inner layer and through-hole land 93 of the first outer layer, is made greater than the thickness (approximately 15 µm) of conductive pattern 40. In the same manner, the thickness (approximately 35 µm) of the through-hole land on the second-surface side, which is made up of through-hole land 92 of the second inner layer and through-hole land 94 of the second outer layer, is made greater than the thickness (approximately 15 µm) of conductive pattern 50.

In doing so, firm metal pillars are formed, suppressing disfigurement of the insulative materials (underfill material 4 and insulative material 3) around electronic component 2.

Figure 5B:
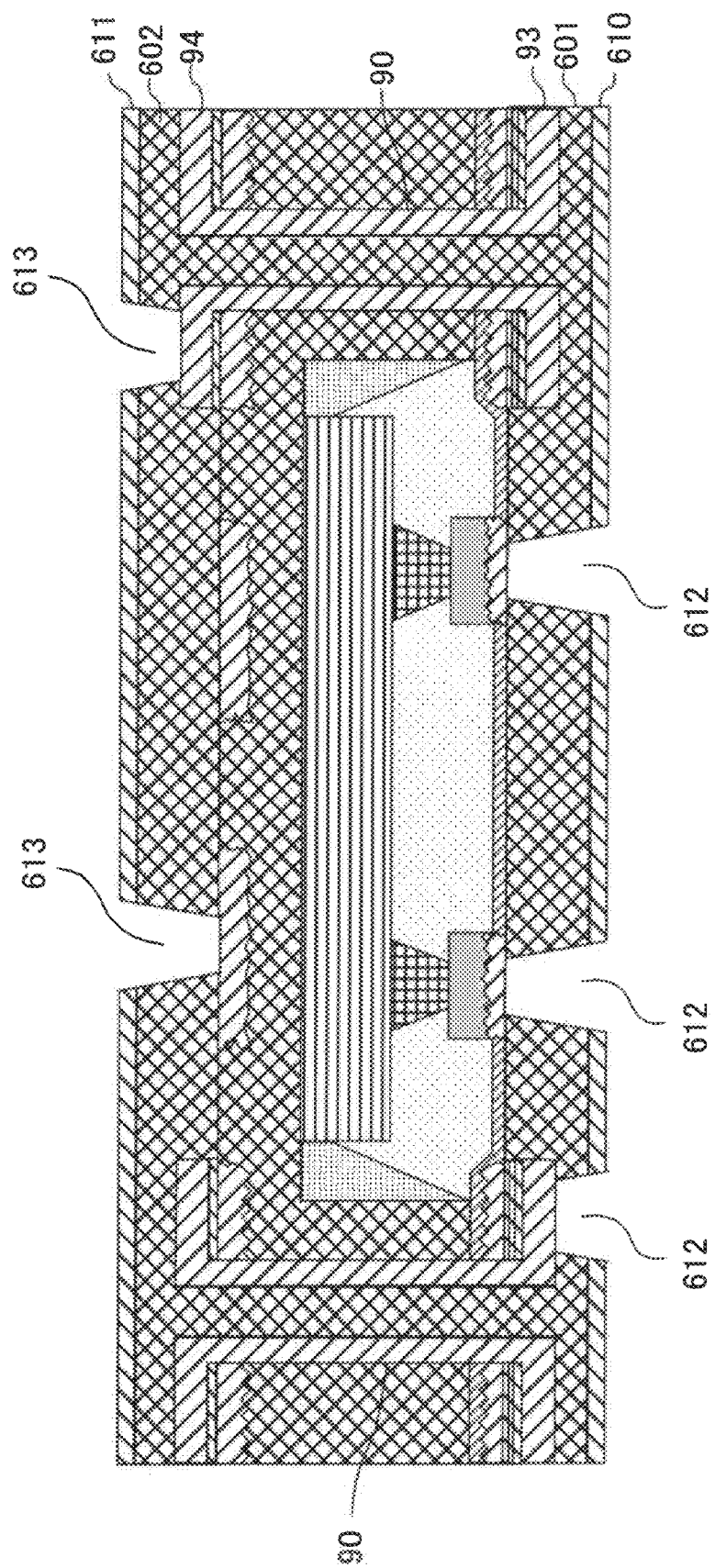
Figure 5C:
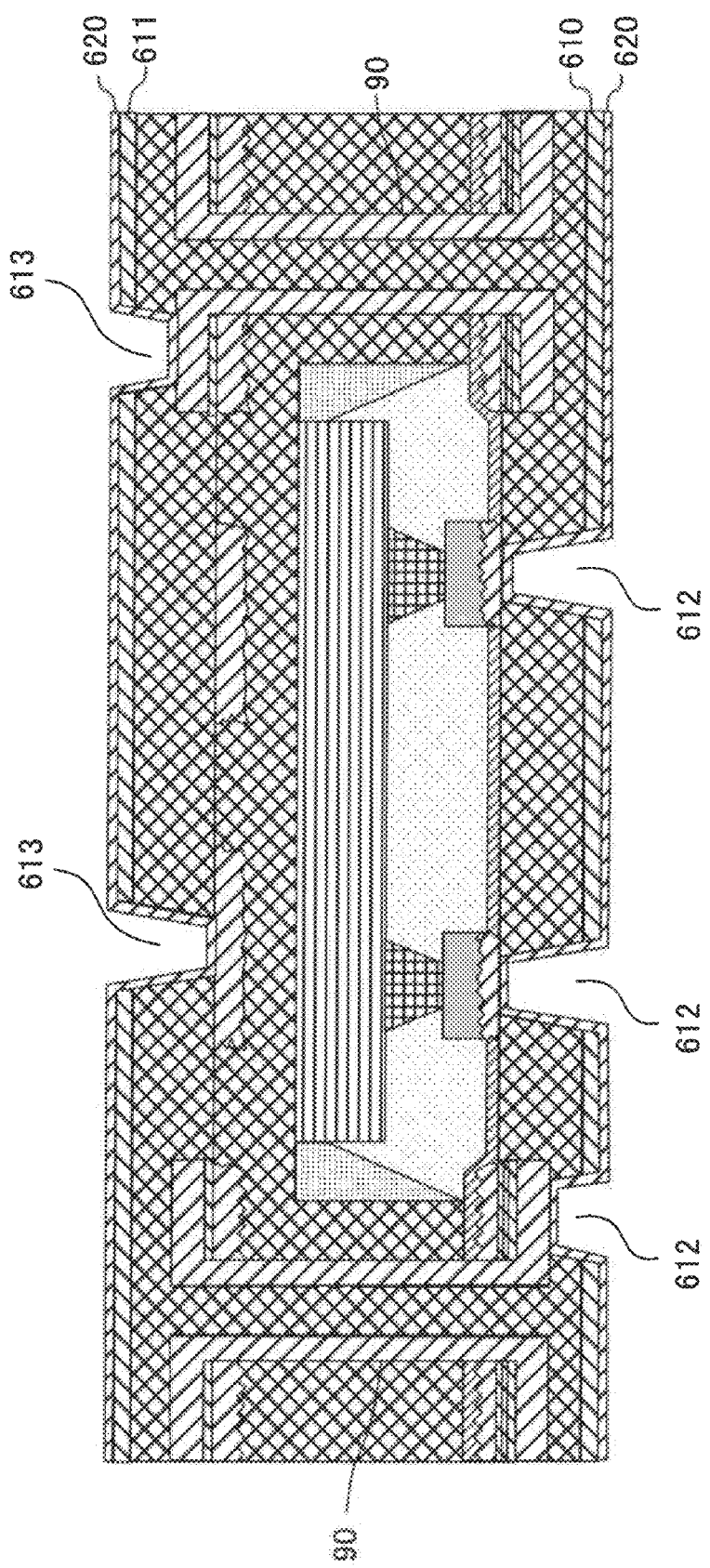
Figure 5F:
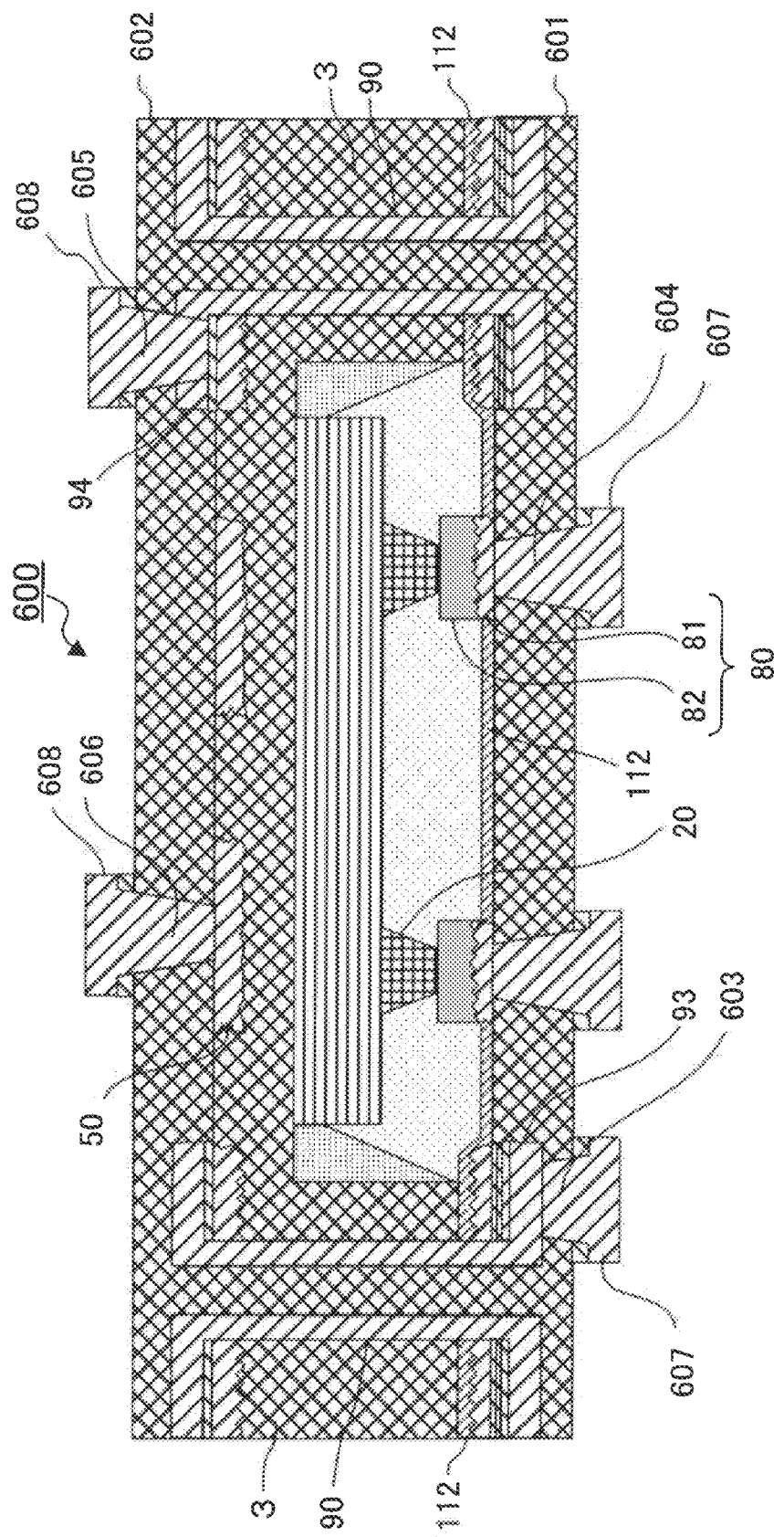
FIG. 5F is a cross-sectional view illustrating the structure of a multilayer wiring board using the wiring board with a built-in electronic component shown in FIG. 4F.

FIG. 5F is a cross-sectional view schematically illustrating multilayer wiring board 600 using wiring board 1 with a built-in electronic component shown in FIG. 4F as a core substrate.

Figure 6:
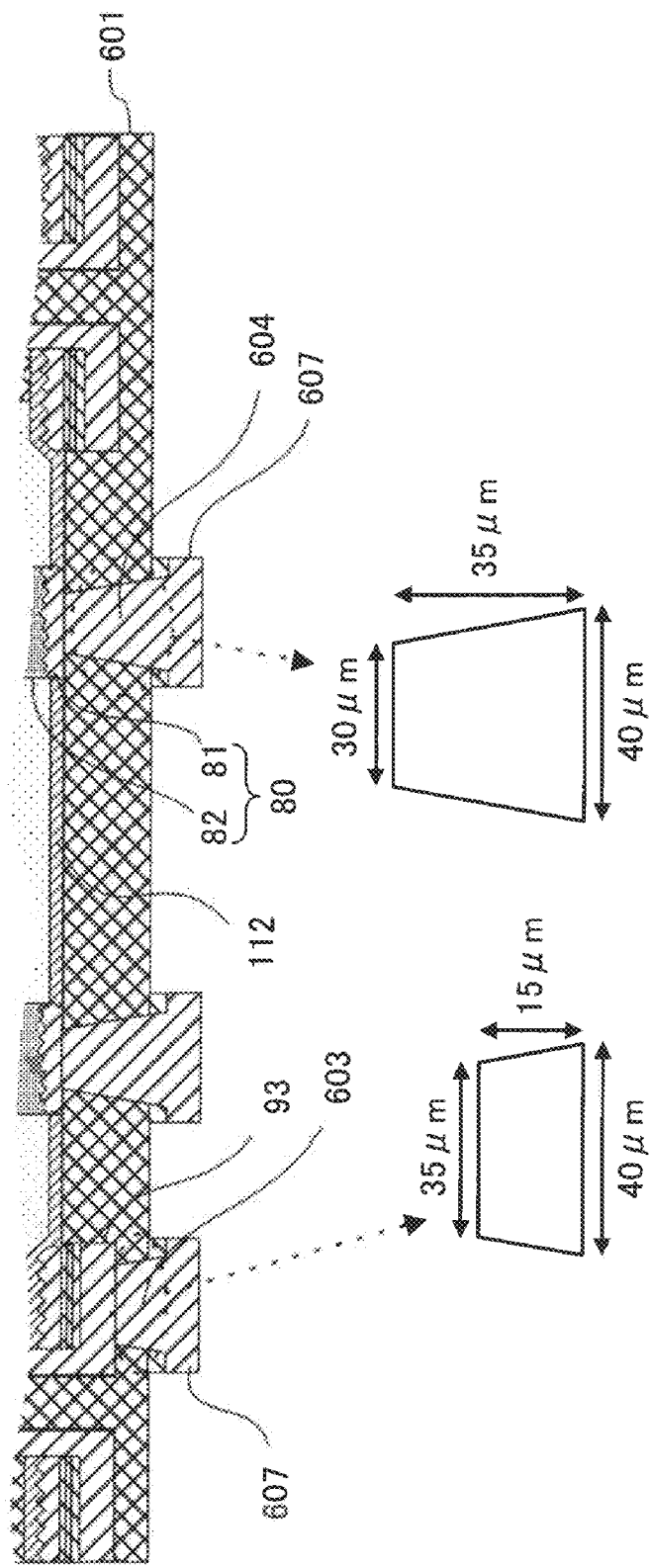
FIG. 6 is a cross-sectional view illustrating the features of the multilayer wiring board shown in FIG. 5F.

In multilayer wiring board 600, when via 603 which connects through-hole land 93 of the first outer layer and conductive pattern 607 is compared with via 604 which connects connection terminal 80 and conductive pattern 607, the aspect ratio is smaller and the contact area is larger in via 603 as shown in FIG. 6. In the same manner, when via 605 is compared with via 606, the aspect ratio is smaller and the contact area is larger in via 605.

Accordingly, in the area surrounding through-holes where thermostresses generally tend to concentrate, the thermostress at the bottom of via 603 (via 605) is reduced and the connection strength is maintained.

Here, a method of manufacturing multilayer wiring board 600 is roughly described with reference to FIGS. 5A-5E.

First, on both main surfaces (on the first surface and the second surface) of wiring board 1 with a built-in electronic component shown in FIG. 4F, board material in a sheet form (prepreg in this embodiment) made by impregnating with resin a reinforcing material such as glass cloth is disposed, and rolling copper or electrolytic copper foil is further disposed on its top and thermopressed. As a result, insulation layers 601, 602 with an approximate thickness of 40 μm and copper foil 610, 611 with an approximate thickness of 12 μm are formed (see FIG. 5A).

During that time, the amount of resin pushed aside by through-hole lands 93 of the first outer layer and through-hole lands 94 of the second outer layer, and the amount of resin entering the interior of through-hole conductors 90 (hollow) offset each other. Accordingly, the surfaces of insulation layers 601, 602 become flat.

In the following, using a carbon dioxide gas ($CO_2$) laser, UV-YAG laser or the like, laser vias (blind holes) 612, 613 are formed at predetermined positions in both main surfaces of the substrate shown in FIG. 5A (see FIG. 5B).

Then, on the entire surfaces of the substrate shown in FIG. 5B, electroless copper plating is performed to form copper-plated layers 620 on both main surfaces and the inner surfaces of laser vias 612, 613 (see FIG. 5C).

Then, after plating resist layers 621, 622 are formed (see FIG. 5D), electrolytic copper plating is performed to form vias 603-606 and copper-plated layers 614, 615 (see FIG. 5E).

Then, from the substrate shown in FIG. 5E, plating resist layers 621, 622 are removed and unnecessary portions of copper foils 610, 611 and copper-plated layers 620 on both main surfaces are etched away. Accordingly, multilayer wiring board 600 having conductive patterns 607, 608 as shown in FIG. 5F is obtained.

The present invention is not limited to the above embodiment, but may be modified variously within the scope of the gist of the present invention.

Figure 7:
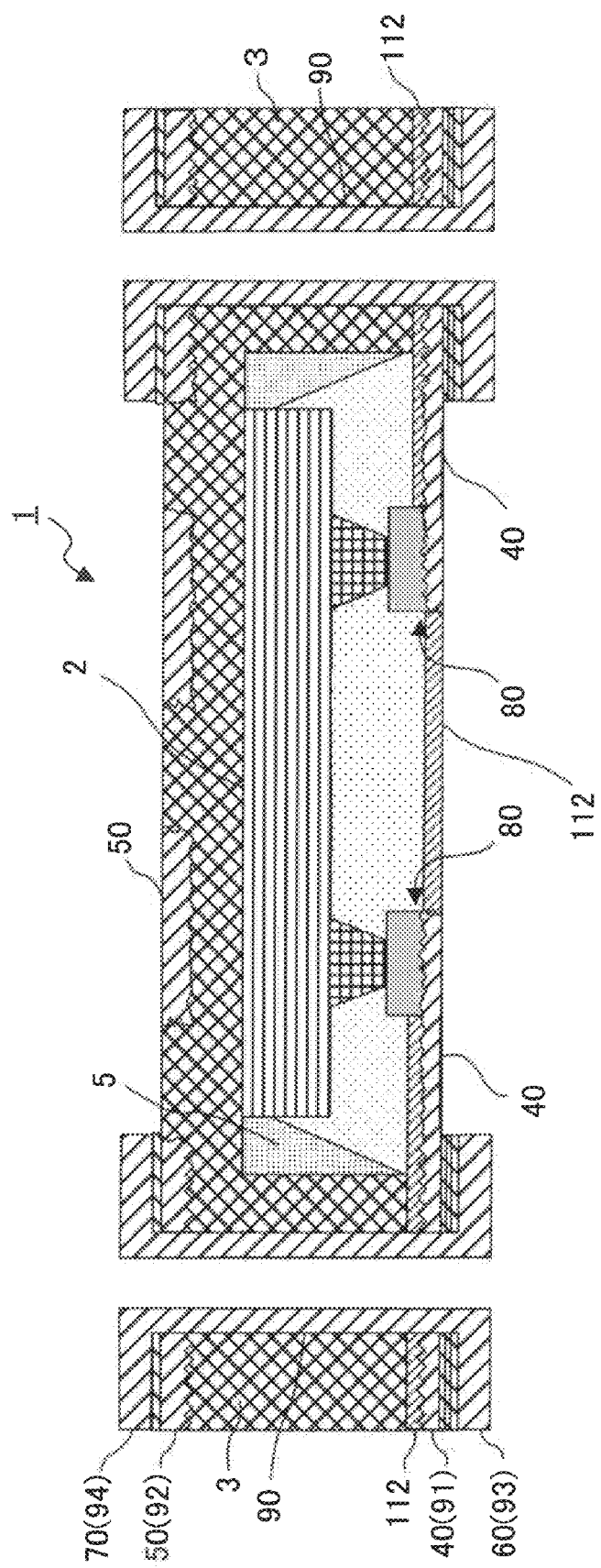
FIG. 7 is a cross-sectional view illustrating the structure of a wiring board with a built-in electronic component according to another embodiment of the present invention.
Figure 8:
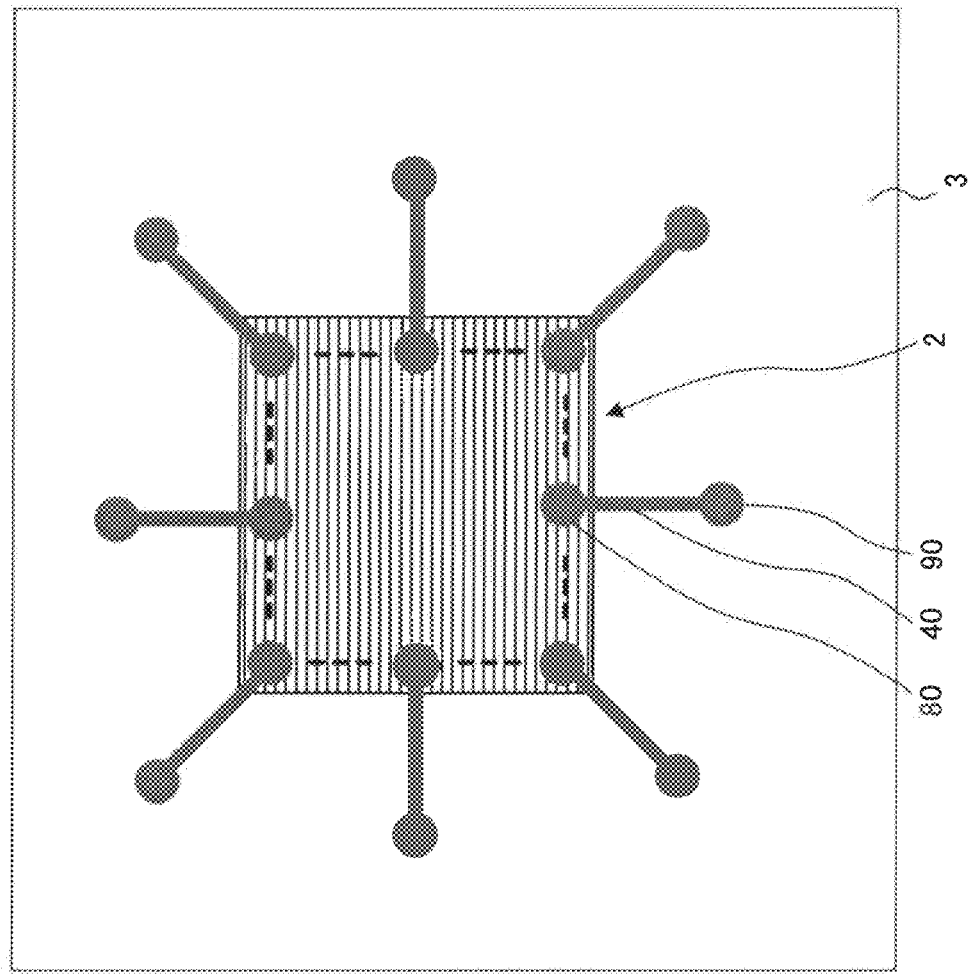
FIG. 8 is a plan view of the wiring board with a built-in electronic component shown in FIG. 6, viewed from the side where the connection terminals are formed.

For example, if the form of the arrangement of terminals in built-in electronic component 2 is a peripheral type or the like, as shown in FIGS. 7, 8, conductive pattern 40 may be formed in such a way that all connection terminals 80 are connected to corresponding through-hole conductors 90. In doing so, it is not necessary to increase the number of layers that electrically connect the circuit portion of electronic component 2 and another circuit portion, thus the wiring board may be made thinner.

Figure 9:
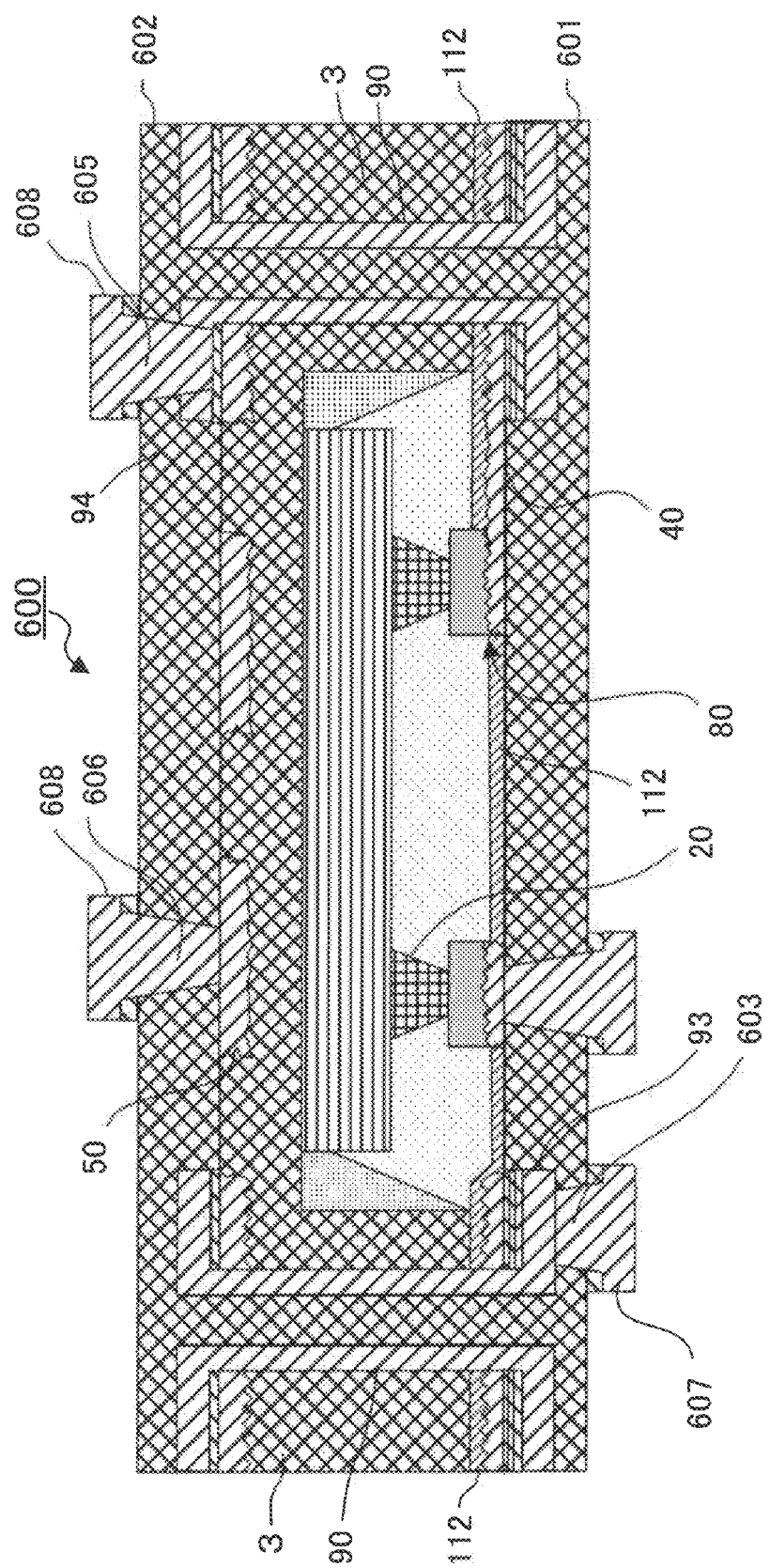
FIG. 9 is a cross-sectional view illustrating the structure of a multilayer wiring board according to another embodiment of the present invention.

Alternatively, multilayer wiring board 600 may have such a structure that some connection terminals 80 are connected to through-hole conductors 90 as shown in FIG. 9.

Also, in multilayer wiring board 600 in the above embodiment, one layer each of insulation layers 601, 602 and of conductive patterns 607, 608 are laminated on their respective main surfaces of wiring board 1 with a built-in electronic component. However, the present invention is not limited to such. Namely, two or more layers may be laminated; the number of layers may be different on both main surfaces. Furthermore, such a layer may be laminated on only one side.

To form fine-pitch connection terminals connected to a built-in electronic component, the surface of a metal layer (which may be formed as multiple layers) from which the connection terminals are formed is required to be flat. Generally speaking, the metal layer is preferred to be of a certain thickness or greater to secure the surface flatness. On the other hand, if the thickness of the metal layer is set large, the connection terminals may be damaged by the etching of the metal layer after the electronic component is mounted.

In addition, in the conventional technology, any insulation layer that makes up the wiring board with a built-in electronic component (which corresponds to the core substrate in a multilayer wiring board) is formed on one side of the center line based on the thickness direction of the core substrate; namely, it is formed only on the surface opposite the joined surface between the electronic component and a conductive layer that makes up the core substrate.

In such an asymmetrical structure, stress from forces (such as heat, impact from vibration or being dropped, etc.) is hard to ease. As a result, the multilayer wiring board may warp. Accordingly, in conventional technology, the problem is that connection reliability of electronic components is difficult to maintain.

A method of manufacturing a wiring board with a built-in electronic component according to one embodiment of the present invention includes: a connection-terminal forming step to form by an additive method a connection terminal for mounting an electronic component on a first metal foil of a first laminated base material, in which the first metal foil is disposed on a support body so as to be detachable; a mounting step to electrically connect the electronic component and the connection terminal by arranging the electronic component on the first laminated base material in such a way that the surface of the electronic component on which a circuit is formed faces the surface on which the connection terminal is formed; a covering step to cover the electronic component with an insulative material after the mounting step; a detaching step to detach the support body and the first metal foil; and a removing step to remove the exposed first metal foil.

It is preferred that another step be carried out after the mounting step to fill insulative resin around the connection terminals.

Also, the following steps may be further carried out: a step to form a conductive pattern on a second metal foil of a second laminated base material, in which the second metal foil is disposed on a support body so as to be detachable; and after the covering step, a step to laminate the second laminated base material in such a way that the surface where the conductive pattern is formed adheres to the surface of the insulative material.

Also, in the covering step, it is preferred to include a step in which the insulative material is disposed so as to be overlaid on the electronic component. In such a case, it is further preferred that the insulative material be made of prepreg and be formed with at least a combination of material processed to have a hollow according to the configuration of the electronic component and material in a sheet form without such a hollow.

Also, the electronic component is preferred to have a bump to bond with the connection terminal.

Also, the connection terminal is preferred to be made at least partly of solder alloy containing tin, silver and copper.

Also, the insulative resin to be filled around the connection terminal is preferred to contain inorganic filler.

Also, the first metal foil is preferred to be a copper foil.

Also, another step may further be carried out to form a penetrating hole in the substrate after the covering step, and then to form a through-hole conductor and a through-hole land to be connected to the through-hole conductor.

Also, the following steps may further be carried out: a step to form an upper-layer conductive pattern on the insulative material with an interlayer insulative material in between; a step to form a via hole for circuit connection that electrically connects the connection terminal and the upper-layer conductive pattern; and a step to form a via hole for through-hole land connection that electrically connects the through-hole land and the upper-layer conductive pattern.

A wiring board with a built-in electronic component according to an embodiment of the present invention has a connection terminal formed by an additive method; an electronic component to be electrically connected to the connection terminal; an insulative material to cover the electronic component; a conductive pattern embedded in the insulative material; a through-hole conductor formed in the insulative material; and a through-hole land connected to the through-hole conductor. Here, the through-hole land protrudes from the surface of the insulative material.

The thickness of the through-hole land is preferred to be set greater than that of the conductive pattern embedded in the insulative material.

The wiring board with a built-in electronic component may further be structured with an upper-layer conductive pattern formed on the insulative material with an interlayer insulative material in between; a via hole for circuit connection that electrically connects the connection terminal or the conductive pattern and the upper-layer conductive pattern; and a via hole for through-hole land connection that electrically connects the through-hole land and the upper-layer conductive pattern.

Furthermore, the area of the connected surface between the via hole for through-hole land connection and the through-hole land may be set larger than the area of the connected surface between the via hole for circuit connection and the connection terminal or the conductive pattern.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a wiring board with a built-in electronic component, comprising:
   providing a first base material comprising a support body and a first metal foil detachably adhered on the support body;
   forming a connection terminal for mounting an electronic component on the first metal foil of the first base material by an additive method;
   mounting an electronic component to the connection terminal such that the electronic component is electrically connected to the connection terminal and mounted on the first base material;
   covering the electronic component with an insulative material structure having a hollow portion such that the electronic component is accommodated in the hollow portion of the insulative material structure after the mounting; and
   detaching the support body from the first metal foil such that a substrate comprising the first base material and the insulative material structure is formed.

2. The method of manufacturing a wiring board with a built-in electronic component according to claim 1, further comprising filling an underfill material comprising an insulative resin in a gap between the electronic component and the first base material after the mounting.

3. The method of manufacturing a wiring board with a built-in electronic component according to claim 1, further comprising:
   providing a second base material comprising a support body and a second metal foil detachably adhered on a support body;
   forming a conductive pattern on the second metal foil of the second base material; and
   laminating the second base material after the covering such that a surface where the conductive pattern is formed adheres to a surface of the insulative material structure.

4. The method of manufacturing a wiring board with a built-in electronic component according to claim 1, wherein the covering comprises disposing a first insulative material board having the hollow portion and a second insulative material board in a sheet form such that the first insulative material board and the second insulative material board form the insulative material structure encasing the electronic component in the hollow portion of the first insulative material.

5. The method of manufacturing a wiring board with a built-in electronic component according to claim 4, wherein each of the first and second insulative material boards comprises a prepreg.

6. The method of manufacturing a wiring board with a built-in electronic component according to claim 1, further comprising forming a bump on the electronic component to bond with the connection terminal.

7. The method of manufacturing a wiring board with a built-in electronic component according to claim 1, wherein the connection terminal comprises a solder alloy comprising tin, silver and copper.

8. The method of manufacturing a wiring board with a built-in electronic component according to claim 2, wherein the underfill material includes an inorganic filler.

9. The method of manufacturing a wiring board with a built-in electronic component according to claim 1, wherein the first metal foil comprises a copper foil.

10. The method of manufacturing a wiring board with a built-in electronic component according to claim 1, further comprising:
    forming a penetrating hole through the substrate comprising the first base material and the insulative material structure; and
    forming a through-hole conductor and a through-hole land connected to the through-hole conductor in and around the penetrating hole.

11. The method of manufacturing a wiring board with a built-in electronic component according to claim 10, further comprising:
    forming an interlayer insulative material layer on the first metal foil of the first base material on an opposite side of the connection terminal;
    forming an upper-layer conductive pattern on the interlayer insulative material layer;
    forming a via hole electrically connecting the connection terminal and the upper-layer conductive pattern through the interlayer insulative material layer; and forming a via hole electrically connecting the through-hole land and the upper-layer conductive pattern through the interlayer insulative material layer.

12. The method of manufacturing a wiring board with a built-in electronic component according to claim 1, further comprising removing an exposed portion of the first metal foil.

13. The method of manufacturing a wiring board with a built-in electronic component according to claim 1, further comprising:

forming a penetrating hole through the substrate comprising the first base material and the insulative material structure such that the penetrating hole penetrates through the first metal foil of the first base material; and forming a through-hole conductor in the penetrating hole such that the through-hole conductor is connected to the first metal foil of the first base material.

14. The method of manufacturing a wiring board with a built-in electronic component according to claim 13, wherein the forming of the through-hole conductor comprises applying copper-plating on an inner wall of the penetrating hole.

* * * * *